(12) United States Patent
Floros

(10) Patent No.: US 8,441,779 B2
(45) Date of Patent: May 14, 2013

(54) ADVERTISING APPARATUS WITH HOOK

(75) Inventor: Donna Floros, Palm Springs, CA (US)

(73) Assignee: Donna M. Floros, Studio City, CA (US)

( * ) Notice: Subject to any disclaimer, the term of this patent is extended or adjusted under 35 U.S.C. 154(b) by 1017 days.

(21) Appl. No.: 12/476,045

(22) Filed: Jun. 1, 2009

(65) Prior Publication Data

US 2009/0303533 A1    Dec. 10, 2009

Related U.S. Application Data

(60) Provisional application No. 61/058,846, filed on Jun. 4, 2008.

(51) Int. Cl.
*H05K 5/00* (2006.01)
*F21V 35/00* (2006.01)
*G09F 3/00* (2006.01)

(52) U.S. Cl.
USPC .............. 361/679.01; 248/225.21; 40/642.01; D20/10

(58) Field of Classification Search .......... 361/679.55–679.59, 679.01–679.45; 455/575.1; 248/301–309.1, 225.21; 340/286.06–286.09; D20/10; 235/380, 235/381
See application file for complete search history.

(56) References Cited

U.S. PATENT DOCUMENTS

| | | | | |
|---|---|---|---|---|
| 264,079 | A * | 9/1882 | Griffis et al. | 40/322 |
| 790,190 | A * | 5/1905 | Cooper | 40/322 |
| 3,978,601 | A * | 9/1976 | Catron | 40/322 |
| D301,523 | S * | 6/1989 | Barbieri et al. | D6/323 |
| 5,221,838 | A * | 6/1993 | Gutman et al. | 235/379 |
| 5,699,039 | A * | 12/1997 | Korzen | 340/311.2 |
| D430,217 | S * | 8/2000 | Hopgood | D20/10 |
| 6,681,109 | B1 * | 1/2004 | Leifer | 455/414.1 |
| 6,745,937 | B2 | 6/2004 | Walsh et al. | |
| 6,789,773 | B2 * | 9/2004 | Holland | 248/307 |
| 7,121,470 | B2 * | 10/2006 | McCall et al. | 235/472.01 |
| 7,372,361 | B1 * | 5/2008 | Mealing | 340/286.09 |
| 2003/0004876 | A1 | 1/2003 | Jacobson | |
| 2008/0164395 | A1 * | 7/2008 | Chang et al. | 248/276.1 |

* cited by examiner

*Primary Examiner* — Jayprakash N Gandhi
*Assistant Examiner* — Nidhi Desai

(57) ABSTRACT

A hook apparatus includes a front side and a back side. A hook extending from the front side is included for hanging objects. A shelter structure extends from the front side positioned around and apart from the hook. The shelter structure may serve as a second hook for hanging objects. A communications device extends from the body, at least a portion of which is above and spaced apart from the shelter structure. The back side of the hook apparatus is adapted to be secured to a surface. An interface adapter plate between the back side and the mounting surface may be provided to enable the securing. The communications device includes a display device that is either passive or capable of interactive communication of information. The apparatus may be operationally coupled to a remote server to alert vendors to deliver purchased products, services, and/or to provide emergency services to the user.

22 Claims, 3 Drawing Sheets

ADVERTISING APPARATUS WITH HOOK

CROSS-REFERENCE TO RELATED APPLICATIONS

This application claims the benefit of Provisional Application Ser. No. 61/058,846, filed Jun. 4. 2008, The disclosure of which is expressly incorporated by reference herein in its entirely.

TECHNICAL FIELD

This disclosure relates to a device for advertising in public venues. More particularly, this disclosure relates to a device for combining advertising, sales, service transactions, and other communication and a convenience hook in a compact apparatus.

BACKGROUND

Many venues, such as stadiums and theaters, provide seating consisting of, for example, seats or backed benches. In such venues it is common for food, drink, souvenirs and other products to be offered for sale to a patron (i.e., "user"). Such sales transactions may occur directly on the venue "floor" at or near a user's seat. Such transactions, which may be available from walking vendors offering products, may be limited to what is immediately available on the venue floor at the time. Alternatively, the user must leave the seat and seek out a particular product at fixed vendor locations distributed around the venue, often out of view of the ongoing event, but without the user's foreknowledge of the location of the vendor, afterwards returning to the seat. This is an inconvenience that may deprive the user of a portion of time which could be better devoted to enjoying the event attended, e.g., a spectator sport.

Furthermore, in public venues there exists a concern for safely in the event of required evacuation. The user is often not conveniently provided with instructions for evacuation or response to a situation of urgency.

In addition to purchases, users often attend such venues with personal property, such as purses, bags, backpacks, outer garments, and the like. It is well known that many of such items are temporarily stored on the floor near or under the user's seat. Such items may become obstacles that impede egress/ingress for users or vendors and may even contribute to accidents, with consequences for liability and litigation.

There is a need, therefore, for an apparatus that may simultaneously improve vendor services, provide critical information support in case of matters of urgency, and improve user safely and convenience.

SUMMARY

A hook apparatus includes a support member with a front side and a back side. A hook extends from the front side of the support member for hanging objects. A shelter structure also extends from the front side of the support member and is positioned partially around but spaced apart from the hook. The shelter structure may also serve as a second hook for hanging objects. A communications device extends from the front side of the support member and has a display positioned above and spaced apart from the shelter structure. The hook and the shelter structure may each have a lip to prevent objects from slipping off. The back side of the support member is adapted to be secured to a mounting surface. An interface adapter plate may be included to enable securing between the back side and the mounting surface.

The display of the communications device may be either a passive mount for receiving a removable insert with an advertising message or other information, or my be an electronic communication device with an electronic display. Communications may be via secure modes of information transmission that are well know. The apparatus may be operationally coupled to a remote server to provide emergency services, information, and coupled to interactive communications whereby a patron could order and purchase products, services, and the like, from vendors.

DETAILED DESCRIPTION

A hook apparatus providing a combination of a hook and information/advertising/communication is disclosed. The hook apparatus may be attached to the back of a seat in front of a patron at a venue, such as, for example, a theater or stadium, or otherwise mounted on any other selected surface. For example, the apparatus may also be placed on doors, walls and in other locations where such apparatus is convenient and beneficial. For example, the hook with advertising may be placed in passenger transportation systems, waiting rooms, and any location where persons may pass through or spend an interval of time, may be in temporary need of safely placing personal property, and would be in a position to receive information, advertising, and the like.

Figure 1:
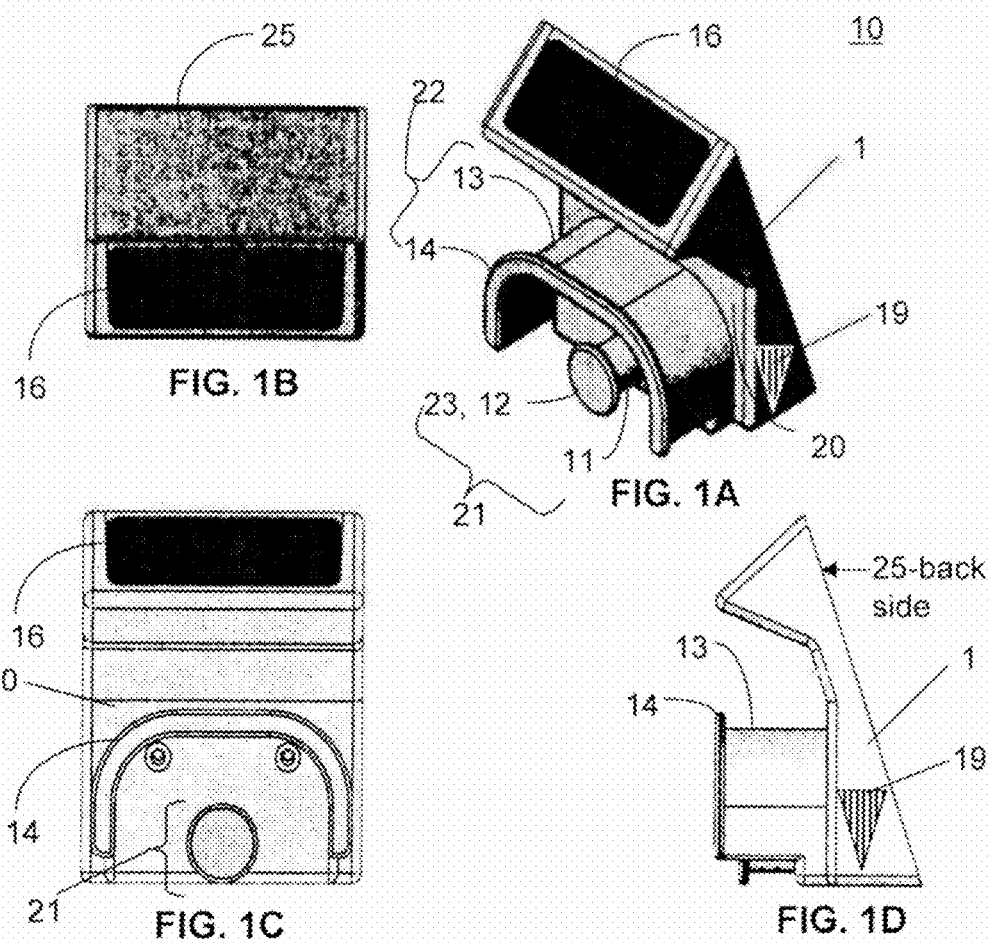
FIG. 1A is a perspective view of an exemplary advertising apparatus with hook according to an embodiment of the disclosure.
FIG. 1B is a top view of the apparatus of FIG. 1A.
FIG. 1C is a from view of the apparatus of FIG. 1A.
FIG. 1D is a side view of the apparatus of FIG. 1A.
Figure 2:
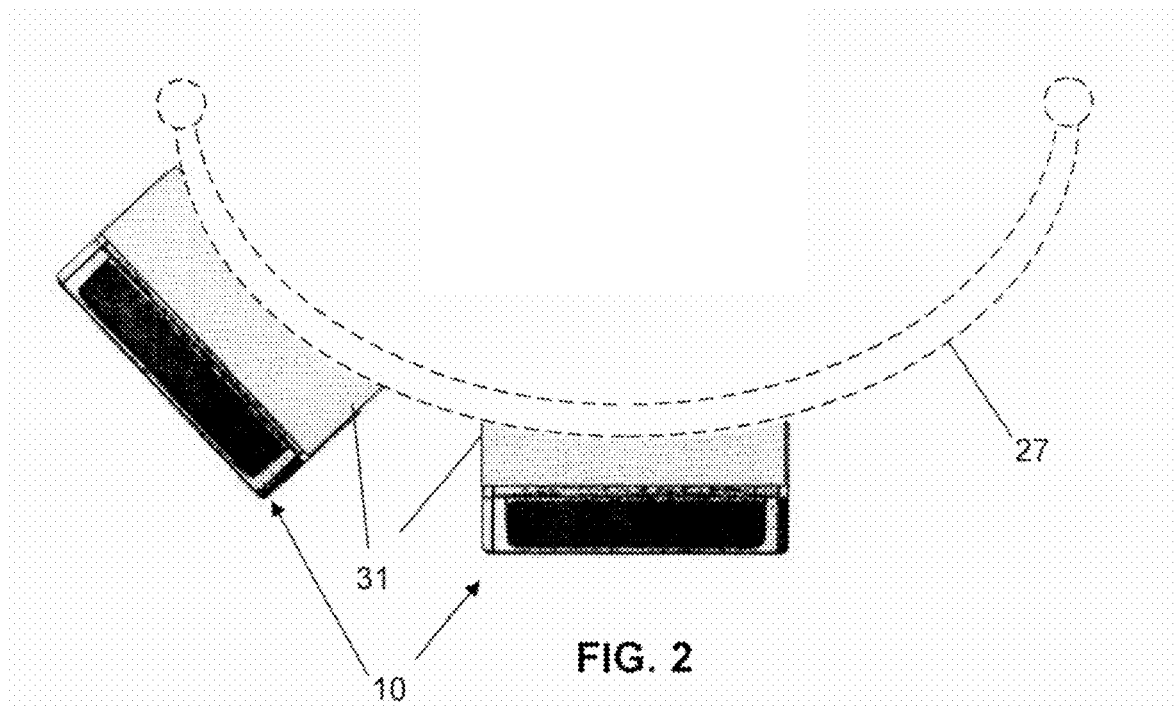
FIG. 2 is an overhead view of the apparatus of FIG. 1A attached to a seat back.

FIGS. 1A to 1D and 2 illustrate various views of an exemplary hook apparatus 10 with a hook 21, according to an embodiment of the disclosure. The hook apparatus 10 includes a support member 1 that has a front side 20 and a back side 25. FIG. 2 is an exemplary illustration of how apparatus 10 is adapted to attach the back side 25 of the hook apparatus 10 to a surface (such as a seat back 27 or a wall) and provides for supporting a parcel hung from the hook 21 while preventing the hook from causing injury or property damage. If the seat back 27 is curved, attachment may be accomplished in a variety of ways, either generically or by customized adaptation to conform to the seal back 27. For example, the shape of the back side 25 of the hook apparatus 10 may be contoured to conform to the shape of the seat back 27 of a venue chair (FIG. 2). Alternatively, the hook apparatus 10 may include an adaptor plate 31 to interface and attach the back side 25 to the seat back 27 (FIG. 2). Attachment mechanisms to secure the hook apparatus 10 to the interface adaptor plate 31 and/or the seat back 27, and to attach the interface adaptor plate 31 to the seat back 27 may include screws, nails, bolts, clips, adhesives, flanges, hooks, and the like. The hook apparatus 10 may be placed on the seat back 27 in various locations, as shown in FIG. 2, for example, where the benefit of placement may include minimizing interference with user comfort, to share the hook apparatus 10 between two users, and the like. In more generic cases, where the surface is flat, for example, the interface adaptor plate 31 may not be needed.

Referring again to FIGS. 1A-1D, the hook apparatus 10 includes the hook 21 extending from the front side 20 of the support member 1, on which a purse, parcel, garment, or other articles, may be hung. The hook apparatus further includes a display device portion 16 of a communication device to provide information. The display device portion 16 extends from the support member 1 preferably above and spaced apart from a shelter structure 22 (described below).

The hook 21 may include a hook protrusion 11 (e.g., a rod) extending from the front side 20 of the hook apparatus 10 of support member 1, the protrusion also having a distal end 23. The hook protrusion 11 may have a hook retention lip 12 at the distal end 23 to prevent hanging articles from slipping off the hook 21. Articles and objects placed on the hook 21 hang downward. A shelter structure 22 "tents" the hook 21 by extending from the front side 20 of the support member 1 as a shelter hook protrusion 13 having a distal end. The shelter structure 22 is in a spaced relationship apart from the hook 21. In an embodiment, the hook 21 may not extend from the front side 20 beyond the extent of the shelter structure 22 in a manner that can cause injury to a person, or damage, such as hooking, snagging and/or tearing clothing as a person passes by. The shelter structure 22 is placed apart and preferably below the display device portion 16.

The shelter structure 22 is preferably curved, having no sharp edges or corners. The shelter structure 22 preferably surrounds the hook 21 on three sides (e.g., above and laterally) to prevent casual or unintended snagging by contact with the hook 21. The shelter structure 22 is configured so that the bottom side of the hook 21 is exposed, enabling objects hung from the hook 21 to hang down freely. The shelter structure 22 may also be shaped to have a shelter hook retention lip 14 at the shelter hook protrusion 13 distal end to provide an additional second hook capability on which to hang additional articles safely while preventing slippage, as described above.

Figure 3:
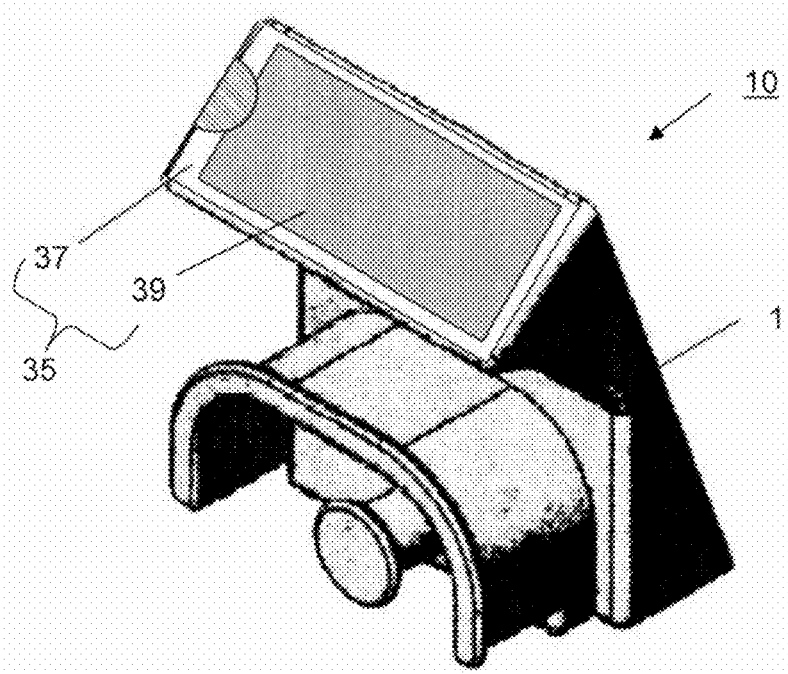
FIG. 3 is a perspective view of the apparatus of FIG. 1A with a card holder for display of advertising and/or information.

Display of information may be passive or electronically active. In one embodiment, referring to FIG. 3, a passive display 35 of hook apparatus 10 may contain a card holder 37 for holding an information card 39. The information card 39 may include advertising, safely information, or the like. In an embodiment, multiple instances (e.g., pages) of information may be provided in the passive display 35, wherein the pages may be changed, as desired, or may be permanent. The passive display may be located in substantially the same location as display device portion 16 of FIG. 1A.

Figure 4:
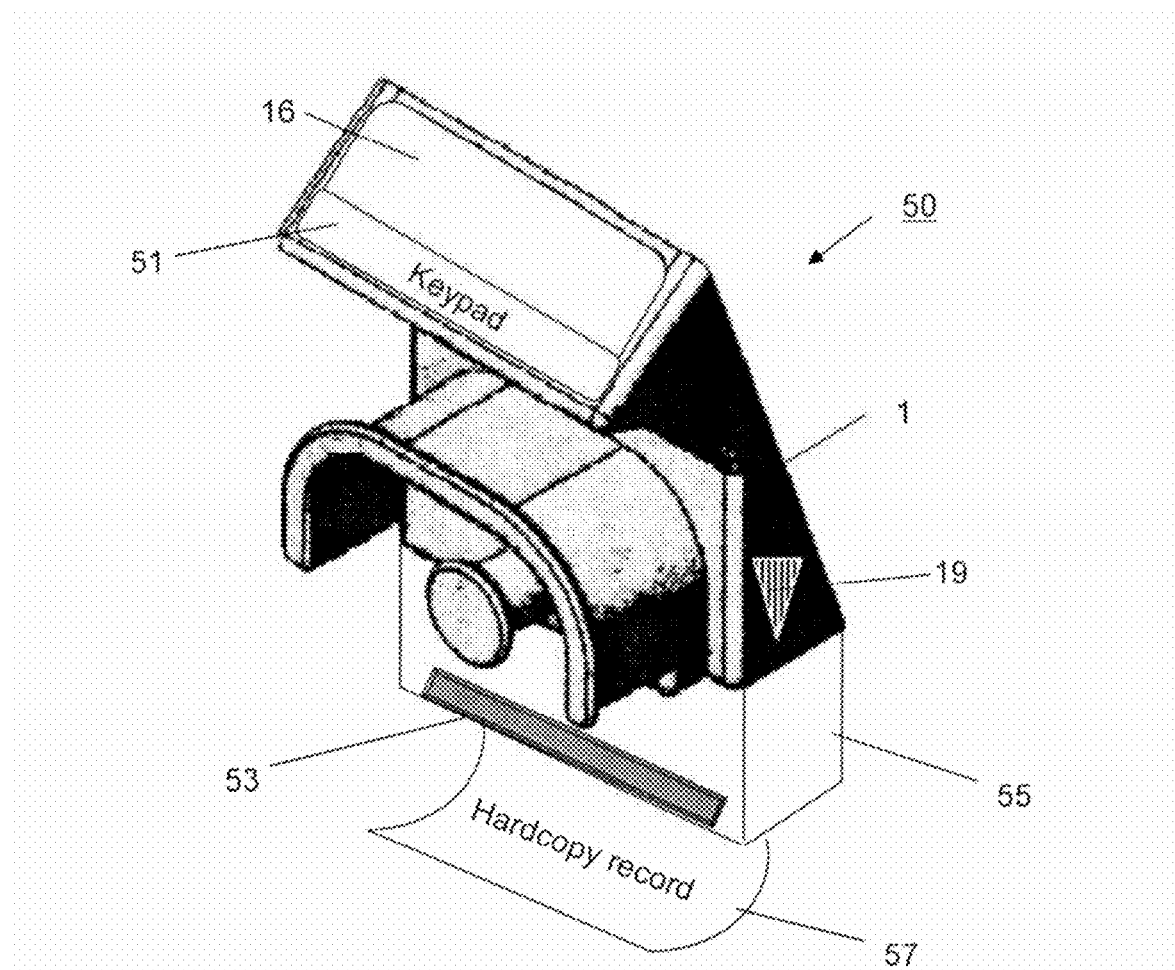
FIG. 4 is a perspective view of an embodiment of the apparatus with a display, a data entry keypad, a transceiver, a debit/credit card reader and a printer.

An active display device portion 16 (e.g., see FIG. 1A) may be provided having an electro-optically active display screen such as, for example, a liquid crystal display, plasma display or the like, and electronics to drive the display screen and interface to a transceiver 19 for communication with a remote server. Electro-optic display devices are well known in the display arts. The transceiver 19 may be located within the active display device portion 16 or, alternatively, elsewhere in the hook apparatus 10 support member 1 (as shown in FIGS. 1A, 1D, and 4). The active display device portion 16 is preferably located above and spaced apart from the shelter structure 22. The active display device portion 16 may further include audio output capability, coupled to the transceiver, to present information audibly.

Referring to FIG. 4, a hook apparatus 50 may further include a keypad 51 comprising, but not limited to, a "hard" typewriter-like keyboard, and/or a "soft button" or "soft-key" touch screen keyboard. Touch screens are also well known in the art of electronic display. Using the keypad 51, a patron (e.g., user) may select from a displayed menu any of a plurality of screens providing information. The keypad 51 is coupled to the display device portion 16 and the transceiver 19.

In one embodiment, power to operate the hook apparatus 10 may be supplied by directly wired power lines (e.g., low voltage, provided from a grid throughout the venue). In another embodiment, the hook apparatus 10 may be powered by batteries.

If the user desires, for example, to find the location of a nearest restroom or food vendor, an interactive menu provided on the display device portion 16 can be navigated via the keypad 51 to direct the user to a nearest location, where the direction may be provided by a map, written and/or audio instructions. For direction/location types of information, it is useful for the hook apparatus 10 to be equipped with self-location capability. In one embodiment, this may be, for example, a hard-wired connection that identifies the location of the hook apparatus 10 at the venue. Alternatively, in an embodiment, the transceiver 19 may be wireless and transmitting a unique signal from which the location can be determined. Additionally, in an embodiment, a global positioning system (GPS), or the like, that locates each apparatus within the venue may perform the same function. Thus, a mapping capability to route the user from his/her seat location to a selected destination is enabled. Examples of wireless communication systems include, but are not limited to. Wi-Fi local area networks, wide area networks (WAN), and broadband wireless networks. In a wireless position location system, location identification data transmitted as a coded transmission by the transceiver 19, and/or triangulation from GPS-type data, or the like, may be used to identify the user location and/or a destination.

In some embodiments, the user may be able to place a menu order for particular foods, beverages or products, which can be delivered to the user's seat. The transaction may be completed, for example, by cash upon delivery, or by credit card transaction, in which case, such transactions may be transmitted securely. Secure communication is a well known field of art (see, for example "Secure Communication"." Wikipedia, at http://en.wikipedia.org/wiki/Secure communication).

A receipt confirmation record of the transaction can be provided, for example, through a credit card transaction, and/or an email. Referring to FIG. 4, in a hook apparatus 50, the debit/credit card transaction may be executed via the keypad 51. Alternatively, the hook apparatus 50 may comprise a debit/credit card reader 53 coupled to the transceiver 19. In an embodiment, a printer 55 may be coupled to the hook apparatus 50 to provide a hardcopy record 57 to the purchaser. The printer may be included in hook apparatus 50 or may be remotely coupled to the hook apparatus 50 by a communications link via the transceiver 19.

Figure 5:
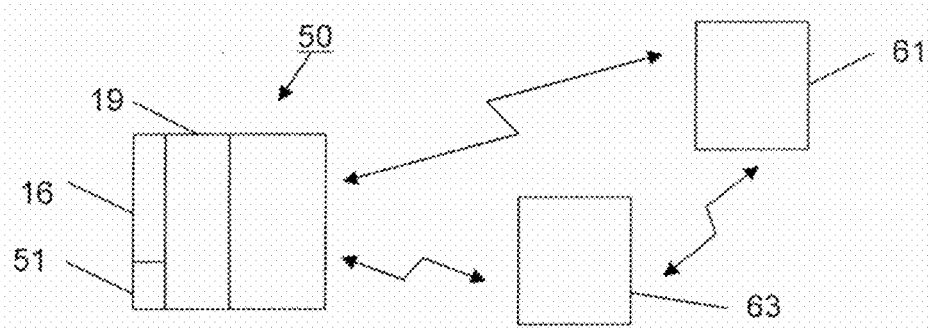
FIG. 5 is a block diagram of an embodiment of the apparatus configured for interactive communication.

FIG. 5 is a block diagram of an embodiment of the hook apparatus 10 engaged in interactive communication. Data entered via the display device portion 16 and the keypad 51 is transmitted from the transceiver 19 to a remote server 61. A mobile vendor may be equipped with a wireless vendor communications device 63 to be alerted by the server 61 that a user at a particular location desires a product supplied by the vendor. The communications device 63 may be equipped with position location capability. A vendor so equipped (preferably nearest to the user) and carrying (or able to obtain) the product, may then receive the order from the server 61 and advance to the identified hook apparatus 50 location to fulfill the transaction request. This may beneficially reduce the wait time for the user to receive the product or service, enable the user to continue enjoying the venue activity (e.g., a spectator sport) with only minor interruption, and reduce the delays a vendor may encounter to identify and fulfill sales opportunities. Such capability enables vendors to achieve faster response to user requests, thereby improving sales volume and user satisfaction.

In addition to being menu-driven, advertising or other information may periodically change and be presented on the display to inform the user of the range of services and products available. In the case of an interactive display, emergency response may also be provided to the seat location when the display is suitably operated, or in emergency situations. For example, first-aid, emergency alert, and evacuation procedures may be displayed for contingency benefit to the user.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A hook apparatus for attachment at a defined location and communicating that location to a remote server comprising: a support member with a front side and a back side, the back side attached to the defined location; a hook protrusion integral with the support member and extending from the front side, the hook protrusion having a distal end; a shelter structure integral with the support member and extending from the front side in spaced relationship to the hook; and a communication device coupled with the support member for effecting communication of the defined location of the hook apparatus to the remote server having at least a portion extending from the support member above and spaced apart from the shelter structure; a hook retention lip on the distal end of the hook protrusion to prevent a first object from sliding off the hook protrusion; a shelter hook protrusion extending from the front side for hanging at least one second object, the shelter hook protrusion having a shelter hook distal end; a shelter hook retention lip on the shelter hook protrusion distal end adapted to prevent the second object from sliding off the shelter hook; wherein the shelter structure surrounds and is spaced apart from the hook above and at both sides lateral to the hook; wherein the communication device comprises: a transceiver for receiving data transmitted to the communication device and transmitting data from the communication device; and an electronically controlled active display device coupled to the transceiver for display of the data; wherein the hook protrusion is a cylindrical rod and the hook retention lip extends around the circumference of the distal end.

2. The apparatus of claim 1, wherein the shelter structure extends from the front side at least as far as the hook protrusion.

3. The apparatus of claim 1, wherein the communication device comprises an active display with the location information provided thereon.

4. The apparatus of claim 3 further comprising a transaction device coupled to the communication device for enabling a transaction with a remote server.

5. The hook apparatus of claim 4, further comprising the communication device integral with and extending from the support member above and spaced apart from the shelter structure.

6. The apparatus of claim 1, further comprising an audio output coupled to the electronically controlled active display device to prove received data in audible format.

7. The apparatus of claim 1, wherein the electronically controlled active display device comprises a keypad coupled to the transceiver for reply data entry in response to received data.

8. The apparatus of claim 7 wherein the keypad is an electromechanical keypad.

9. The apparatus of claim 7 wherein the keypad is a touch screen keypad.

10. The apparatus of claim 7 further comprising a transaction device to enable a transaction, the transaction device being coupled to the communication device and selected from at least one of a credit/debit card reader and the keypad.

11. The apparatus of claim 10 further comprising a printer coupled to the communication device to provide a hardcopy record of the transaction.

12. The apparatus of claim 1 wherein the back side is mounted to a surface at the location.

13. The apparatus of claim 12 further comprising an interface adapter plate to mount the apparatus to the surface.

14. The apparatus of claim 1 wherein the backside is mounted to the back of a seat at the location.

15. The apparatus of claim 1 wherein the hook protrusion is a cylindrical rod.

16. The apparatus of claim 1 wherein the shelter structure extends beyond the distal end of the hook protrusion.

17. the apparatus of claim 1 wherein the shelter structure is located above and on both sides of the hook to prevent lateral unintended contact with the hook protrusion.

18. A hook apparatus for attachment at a defined location comprising: a support member with a front side and a back side, the back side attached to the defined location; a hook protrusion integral with the support member and extending from the front side of the support member, the hook protrusion having a distal end; and a shelter structure integral with the support member and extending from the front side of the support member beyond the distal end of the hook protrusion in spaced relationship to the hook; a communication device integral with and extending from the support member above and spaced apart from the shelter structure, the communication device effecting the communication of the defined location of the hook apparatus to a remote server; a hook retention lip on the distal end of the hook protrusion to prevent a first object from sliding off the hook protrusion; a shelter hook protrusion extending from the front side for hanging at least one second object, the shelter hook protrusion having a shelter hook distal end; and a shelter hook retention lip on the shelter hook protrusion distal end adapted to prevent the second object from sliding off the shelter hook; wherein the shelter structure is spaced apart from the hook above and at both sides lateral to the hook; wherein the hook protrusion is a cylindrical rod and the hook retention lip extends around the circumference of the distal end; and wherein the communication device comprises: a transceiver for receiving data transmitted to the communication device and transmitting data from the communication device; and an electronically controlled active display device coupled to the transceiver for display of the data.

19. The apparatus of claim 18 wherein the shelter structure extends from the front side at least as far as the hook protrusion.

20. A hook apparatus for attachment at a defined location and communicating that location to a remote server comprising: a support member with a front side and a back side, the back side attached to the defined location; a hook protrusion integral with and extending from the front side of the support member; a shelter member integral with and extending from the front side of the support member; and a communication device integral with the support member for effecting communication of the defined location of the hook apparatus to the remote server; wherein the communication device comprises: a transceiver for receiving data transmitted to the communication device and transmitting data from the communication device, and an electronically controlled active display device coupled to the transceiver for display of the data; a hook retention lip on the distal end of the hook protrusion to prevent a first object from sliding off the hook protrusion; a shelter hook protrusion extending from the front side for hanging at least one second object, the shelter hook protrusion having a shelter hook distal end; a shelter hook retention lip on the shelter hook protrusion distal end adapted to prevent the second object from sliding off the shelter hook; wherein the shelter structure surrounds and is spaced apart from the hook above and at both sides lateral to the hook; wherein the hook protrusion is a cylindrical rod and the hook retention lip extends around the circumference of the distal end.

21. The apparatus of claim 20 further comprising a transaction device to enable a transaction, the transaction device coupling to the communication device for exchanging data regarding the transaction.

22. The apparatus of claim 20 wherein the communication device comprises a passive display with the location information provided thereon.

* * * * *